US009190500B2

(12) United States Patent
Hirohata

(10) Patent No.: US 9,190,500 B2
(45) Date of Patent: Nov. 17, 2015

(54) SPIN POLARIZATION TRANSISTOR ELEMENT

(71) Applicants: Japan Science and Technology Agency, Kawaguchi-shi, Saitama (JP); The University of York, Heslington, York, [North Yorhshire] (GB)

(72) Inventor: Atsufumi Hirohata, Heslington (GB)

(73) Assignees: Japan Science and Technology Agency, Kawaguchi-shi, Saitama (JP); The University of York, Heslington, York, North Yorkshire (GB)

( * ) Notice: Subject to any disclaimer, the term of this patent is extended or adjusted under 35 U.S.C. 154(b) by 0 days.

(21) Appl. No.: 14/421,227

(22) PCT Filed: Jul. 25, 2013

(86) PCT No.: PCT/JP2013/070217
§ 371 (c)(1),
(2) Date: Feb. 12, 2015

(87) PCT Pub. No.: WO2014/027555
PCT Pub. Date: Feb. 20, 2014

(65) Prior Publication Data
US 2015/0200282 A1    Jul. 16, 2015

(30) Foreign Application Priority Data

Aug. 14, 2012 (JP) ................ P2012-179763

(51) Int. Cl.
*H01L 29/00* (2006.01)
*H01L 29/66* (2006.01)
(Continued)

(52) U.S. Cl.
CPC ........ *H01L 29/66984* (2013.01); *H01L 27/228* (2013.01); *H01L 29/20* (2013.01); *H01L 29/778* (2013.01); *H01L 29/82* (2013.01)

(58) Field of Classification Search
CPC . H01L 29/66984; H01L 29/82; H01L 29/778; H01L 29/20; H01L 27/228
See application file for complete search history.

(56) References Cited

U.S. PATENT DOCUMENTS 6,043,515 A * 3/2000 Kamiguchi et al. .......... 257/103
6,963,091 B1   11/2005 Vashchenko et al.
(Continued)

FOREIGN PATENT DOCUMENTS

EP    2 190 022 A1    5/2010
JP    H08-249875 A    9/1996
(Continued)

OTHER PUBLICATIONS

International Search Report received for PCT Patent Application No. PCT/JP2013/070217 mailed on Sep. 17, 2013.
(Continued)

*Primary Examiner* — Nikolay Yushin
(74) *Attorney, Agent, or Firm* — Amster, Rothstein & Ebenstein, LLP

(57) ABSTRACT

There are provided with a source part made of a ferromagnetic material magnetized in a first direction, a drain part made of a ferromagnetic material magnetized in the first direction, and separated from and arranged in parallel to the source part, a channel part arranged between the source part and the drain part, and bonded with the source part and the drain part directly or through a tunnel layer, and a circularly polarized light irradiation part that irradiates the channel part with circularly polarized light for controlling a direction of spin of the channel part.

13 Claims, 9 Drawing Sheets

(51) Int. Cl.
  *H01L 29/778* (2006.01)
  *H01L 29/20* (2006.01)
  *H01L 29/82* (2006.01)
  *H01L 27/22* (2006.01)

(56) References Cited

U.S. PATENT DOCUMENTS

| | | | |
|---|---|---|---|
| 7,254,150 B2* | 8/2007 | Yoshida et al. | 372/43.01 |
| 2001/0031547 A1 | 10/2001 | Ohno et al. | |
| 2004/0113188 A1* | 6/2004 | Schmidt et al. | 257/295 |
| 2005/0263751 A1* | 12/2005 | Hall et al. | 257/14 |
| 2006/0138502 A1* | 6/2006 | Sugahara et al. | 257/295 |
| 2009/0175110 A1 | 7/2009 | Zayets et al. | |
| 2009/0256142 A1* | 10/2009 | Hirai | 257/40 |
| 2013/0200457 A1* | 8/2013 | Ogimoto | 257/347 |

FOREIGN PATENT DOCUMENTS

| | | |
|---|---|---|
| JP | 2003-092412 A | 3/2003 |
| JP | 2003-224333 A | 8/2003 |
| JP | 2004-531881 A | 10/2004 |
| JP | 2005-011907 A | 1/2005 |
| JP | 2006-146718 A | 6/2006 |
| JP | 2008-166689 A | 7/2008 |
| JP | 2009-141131 A | 6/2009 |
| JP | 2009-164447 A | 7/2009 |
| JP | 2011-187861 A | 9/2011 |
| JP | 2012-049202 A | 3/2012 |
| WO | 02/023638 A3 | 3/2002 |
| WO | 02075344 A2 | 9/2002 |

OTHER PUBLICATIONS

Written Opinion of the International Searching Authority for PCT Patent Application No. PCT/JP2013/070217 mailed on Sep. 17, 2013.

Supriyo Datta and Biswajit Das, "Electronic analog of the electro—optic modulator", Applied Physics Letters, vol. 56, Issue 7, pp. 665-667 (1990), American Institute of Physics.

Hanan Dery et al., "Spintronics for electrical measurement of light polarization", Journal of Applied Physics, American Institute of Physics, vol. 100, Issue 6, pp. 063713-1-063713-7, (2006).

European Patent Office, "Extended European Search Report," issued in European Patent Application No. 13 87 9354.2, which is a European Counterpart of U.S. Appl. No. 14/421,227, with an issuance date of Aug. 4, 2015, 10 pages.

* cited by examiner (A)

(B)

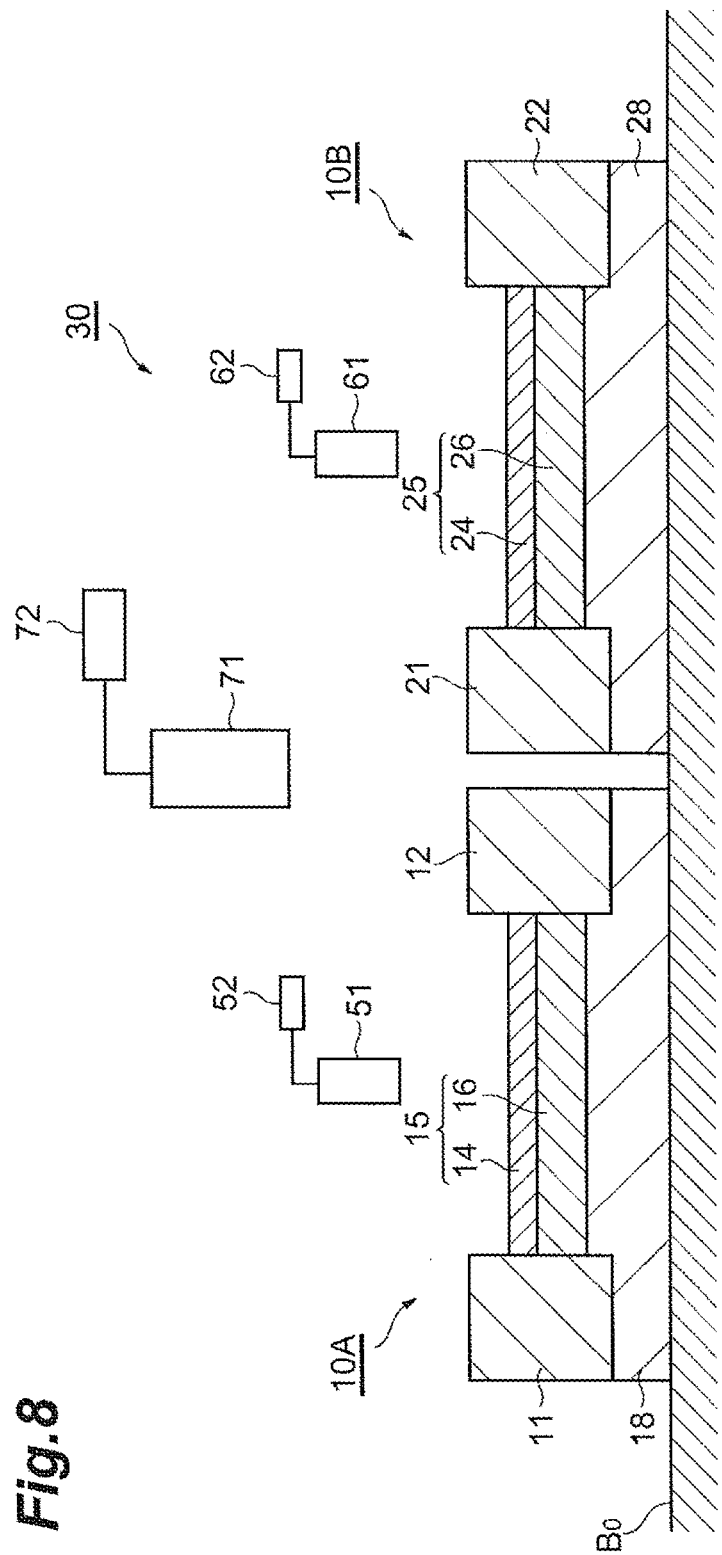

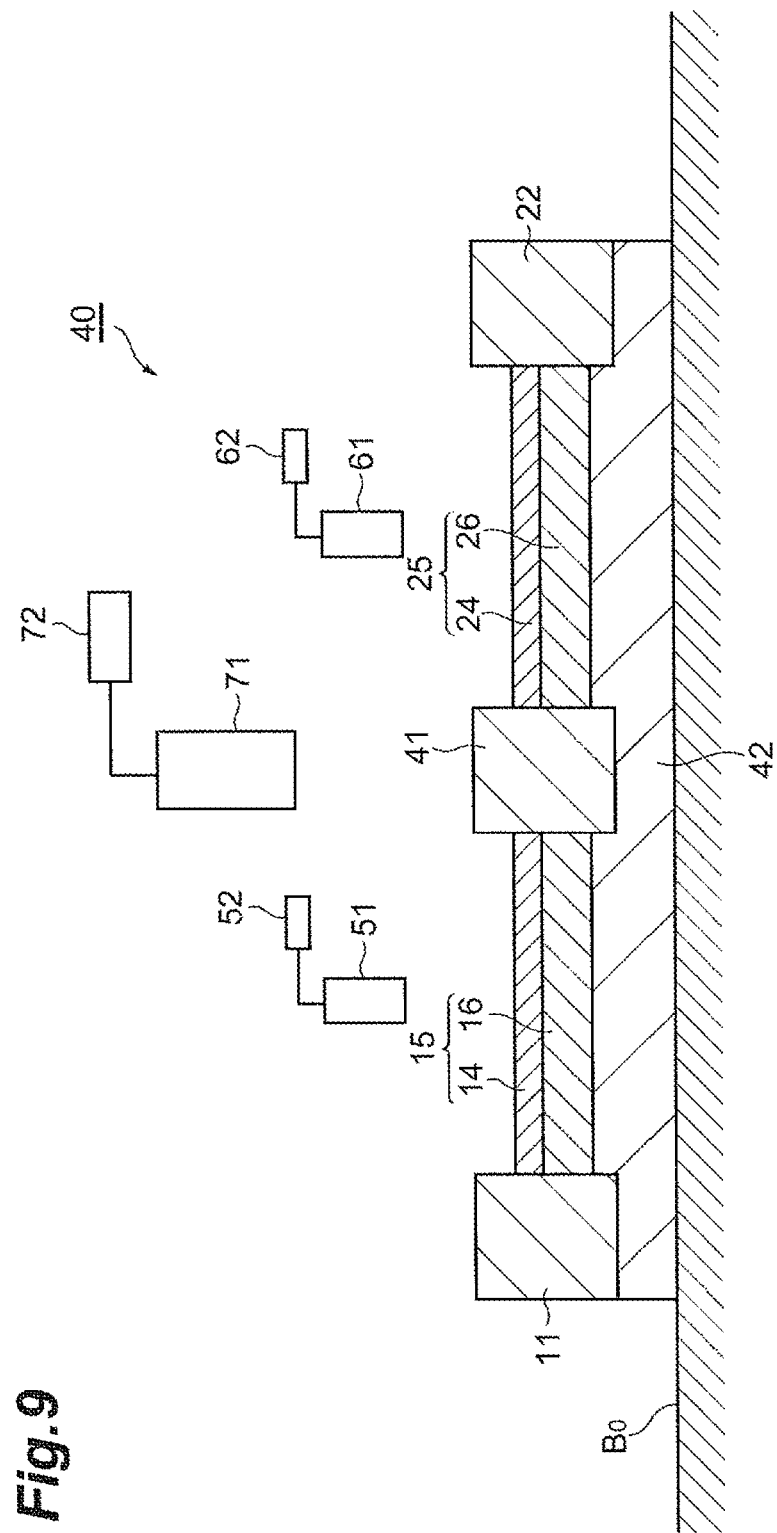

SPIN POLARIZATION TRANSISTOR ELEMENT

This application is a National Stage entry under 35 U.S.C. 371 of International Patent Application No. PCT/JP2013/070217, filed on Jul. 25, 2013, which claims the benefit of and priority to Japanese Patent Application No. P2012-179763, filed on Aug. 14, 2012, the entire contents of each of which are incorporated by reference herein.

TECHNICAL FIELD

The present invention relates to a spin polarization transistor element.

BACKGROUND ART

Conventionally, as a spin polarization transistor element, a spin polarization transistor element that includes a source and a drain made of a ferromagnetic material, a channel layer made of a non-magnetic material and bonded with the source and the drain directly or through a tunnel insulation layer, and a gate electrode provided on the channel layer directly or through a gate insulator layer, and which controls a potential of the channel layer is known (for example, see Patent Literature 1 and Non Patent Literature 1). Transistors described in Patent Literature 1 and Non Patent Literature 1 apply an electric field to the channel layer using the gate electrode, and controls rotation of electron spin in the channel layer, thereby to control ON/OFF of a current between the source and the drain.

CITATION LIST

Patent Literature

Patent Literature 1: Japanese Patent Application Laid-Open No. 2011-187861

Non Patent Literature

Non Patent Literature 1: S. Datta and B. Das, "Electronic Analog of the Electrooptic Modulator", Applied Physics Letters, Feb. 12, 1990, pp. 665 to 667

SUMMARY OF INVENTION

Technical Problem

With downsizing of hardware of recent years, downsizing is also required for transistors. However, the transistors described in Patent Literature 1 and Non Patent Literature 1 need to secure a space for arranging the gate electrode for voltage application between the source and the drain, and thus there are restrictions on the degree of freedom in arrangement of the source and the drain. Therefore, as a result, downsizing of the transistors becomes difficult. In this technical field, transistors having a downsizable structure are desired.

Solution to Problem

A spin polarization transistor element according to one aspect of the present invention includes: a source part made of a ferromagnetic material magnetized in a first direction; a drain part made of a ferromagnetic material magnetized in the first direction, and separated from and arranged in parallel to the source part; a channel part arranged between the source part and the drain part, and bonded with the source part and the drain part directly or through a tunnel layer; and a circularly polarized light irradiation part configured to irradiate the channel part with circularly polarized light for controlling a direction of spin of the channel part.

With such a configuration, the circularly polarized light irradiation part irradiates the channel part with the circularly polarized light, electrons with polarized spin are excited in the channel part, and electrical resistance of the channel part is changed. As described above, the direction of spin can be controlled using the circularly polarized light in a non-contact manner. Therefore, the direction of spin is controlled only with the irradiation of the circularly polarized light, whereby a gate electrode becomes unnecessary, and the degree of freedom in arrangement of the source part and the drain part is improved. Alternatively, application of a voltage and the irradiation of the circularly polarized light are used together, whereby a mechanism for applying the voltage itself can be simplified. Therefore, the transistor element can be downsized, and the degree of freedom in design of the element can be improved.

In an embodiment, the channel part may be formed of a semiconductor material, and the circularly polarized light irradiation part may irradiate the channel part with circularly polarized light having a wavelength corresponding to energy of band gap energy or more of the channel part. With such a configuration, when the channel part is irradiated with the circularly polarized light, spin in the semiconductor material that forms the channel part can be transferred from a valence band to a conduction band. Therefore, a current injected from the source part can be caused to more efficiently flow to the drain part.

In an embodiment, the channel part may be formed of gallium arsenide (GaAs). With such a configuration, the circularly polarized light irradiation part irradiates the channel part with the circularly polarized light having a wavelength corresponding to band gap energy of GaAs or slightly higher energy, whereby spin of the channel part can be transferred from the valence band to the conduction band. Therefore, the current injected from the source part can be caused to more efficiently flow to the drain part.

In an embodiment, the circularly polarized light irradiation part may irradiate the channel part with the circularly polarized light in a direction along a first direction. In an embodiment, a substrate is included, the source part and the drain part are formed on the substrate, the first direction is a direction perpendicular to the substrate, and the circularly polarized light irradiation part may irradiate the channel part with the circularly polarized light in a direction along the first direction. In an embodiment, a substrate is included, the source part and the drain part are formed on the substrate, the first direction is a substrate in-plane direction, and the circularly polarized light irradiation part may irradiate the channel part with the circularly polarized light such that an approach angle of the circularly polarized light to the channel part becomes an angle smaller than 90 degrees.

With such a configuration, the circularly polarized light is irradiated, and the directions of spin of the channel part can be aligned to the first direction, that is, a magnetization direction of the source part and the drain part. Therefore, the current injected from the source part can be caused to flow to the drain part.

In an embodiment, the channel part may include a two-dimensional electron gas layer. With such a configuration, spin is supplied from the two-dimensional electron gas. Therefore, propagation of angular momentum of the spin in the channel part can be efficiently performed.

In an embodiment, thicknesses of the source part and the drain part may be a thickness exceeding an approach length of the circularly polarized light. In an embodiment, thicknesses of the source part and the drain part may be thicker than the thickness of the channel part.

With such a configuration, even if the source part and the drain part are irradiated with light, only the spin of the channel part can be controlled.

Further, a spin polarization transistor element according to another aspect of the present invention includes a first source part made of a ferromagnetic material magnetized in a first direction, a first drain part made of a ferromagnetic material magnetized in the first direction, and separated from and arranged in parallel to the first source part, a first channel part arranged between the first source part and the first drain part, and bonded with the first source part and the first drain part directly or through a tunnel layer, a second source part made of a ferromagnetic material magnetized in a second direction, a second drain part made of a ferromagnetic material magnetized in the second direction, and separated from and arranged in parallel to the second source part, a second channel part arranged between the second source part and the second drain part, and bonded with the second source part and the second drain part directly or through a tunnel layer, and a circularly polarized light irradiation part configured to irradiate the first channel part and the second channel part with circularly polarized light for controlling directions of spin of the first channel part and the second channel part.

With such a configuration, the circularly polarized light irradiation part irradiates the first channel part and the second channel part with the circularly polarized light, electrons with polarized spin are excited in the first channel part and the second channel part, and electrical resistance of the first channel part and the second channel part is changed. Therefore, the current injected from the first and second source parts can be caused to flow to the first and second drain parts without using a gate electrode. Therefore, the transistor element can be downsized. Further, a plurality of spin polarization transistors are irradiated with the circularly polarized light, whereby the plurality of spin polarization transistors can be collectively controlled.

In an embodiment, a first circularly polarized light irradiation part configured to irradiate the first channel part with the circularly polarized light to control spin in a substance that configures the first channel part, and a second circularly polarized light irradiation part configured to irradiate the second channel part with the circularly polarized light to control spin in a substance that configures the second channel part may be provided. With such a configuration, collective control and individual control of the plurality of spin polarization transistors can be realized.

In an embodiment, thicknesses of the first source part, the second source part, the first drain part, and the second drain part may be a thickness exceeding an approach length of the circularly polarized light. In an embodiment, the thicknesses of the first source part and the first drain part may be thicker than the thickness of the first channel part, and the thicknesses of the second source part and the second drain part may be thicker than the thickness of the second channel part.

With such a configuration, even if the source part and the drain part are irradiated with light, only the spin of the channel part can be controlled.

Advantageous Effects of Invention

As described above, according to various aspects and embodiments of the present invention, a transistor element having a downsizable structure can be provided.

BRIEF DESCRIPTION OF DRAWINGS

FIG. 8 is a schematic diagram for describing a spin polarization transistor element in a fourth embodiment.

FIG. 9 is a schematic diagram for describing a modification of a spin polarization transistor element of an embodiment.

DESCRIPTION OF EMBODIMENTS

Hereinafter, embodiments of the present invention will be specifically described with reference to the appended drawings. Note that the same elements are denoted with the same reference sign in the description of the drawings, and overlapping description is omitted. Further, dimension ratios of the drawings do not necessarily accord with the description.

First Embodiment

Figure 1:
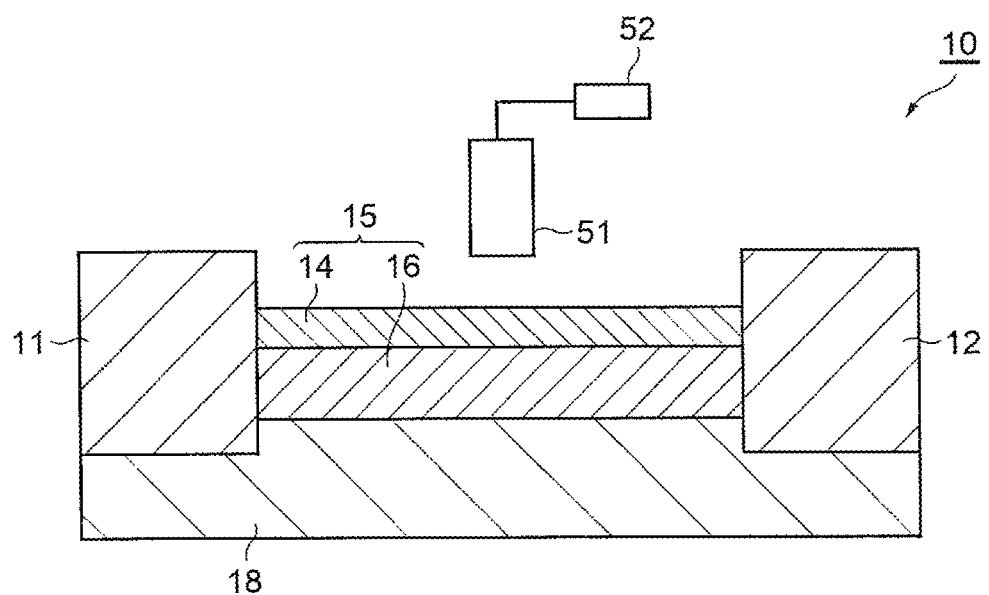
FIG. 1 is a schematic cross-sectional view for describing a spin polarization transistor element according to a first embodiment.

A spin polarization transistor element according to the present embodiment is a transistor element that is an application of spin polarization, and is favorably employed as a nanoscale switching element, for example. FIG. 1 is a schematic cross-sectional view for describing a spin polarization transistor element 10 according to an embodiment. As illustrated in FIG. 1, the spin polarization transistor element 10 includes, for example, a source part 11, a drain part 12, a channel part 15, and a circularly polarized light irradiation part 51.

The source part 11 is formed on a substrate 18. As the substrate 18, a semiconductor substrate is used, for example. The source part 11 is formed of a ferromagnetic material. As the ferromagnetic material, Fe, Co, or Ni is used, for example. The source part 11 can be magnetized in an arbitrary first direction. The first direction is a substrate in-plane direction (an arbitrary direction parallel to a substrate surface) or a substrate vertical direction, for example. The source part 11 is provided with a terminal for voltage application. The thickness of the source part 11 from the substrate 18 is a thickness exceeding an approach length of circularly polarized light, and is several tens of nm or more, for example.

The drain part 12 is formed on the substrate 18, and is separated from and arranged in parallel to the source part 11.

The drain part 12 is formed of a ferromagnetic material. As the ferromagnetic material, Fe, Co, or Ni is used, for example. The drain part 12 can be magnetized in the substrate in-plane direction or the substrate vertical direction (first direction). Here, the drain part 12 can be magnetized in an arbitrary first direction. The first direction is the substrate in-plane direction or the substrate vertical direction, for example. The drain part 12 is magnetized in the same direction as the source part 11. The drain part 12 is provided with a terminal for voltage detection. The thickness of the drain part 12 from the substrate 18 is a thickness exceeding the approach length of the circularly polarized light, and is several tens of nm or more, for example.

The channel part 15 is arranged between the source part 11 and the drain part 12, and is directly bonded with the source part 11 and the drain part 12. The channel part 15 is formed of a non-magnetic material. As the non-magnetic material, a semiconductor material such as Si or gallium arsenide (GaAs), or a non-magnetic metal such as Ag or Cu is used, for example. Note that, for example, when a GaAs substrate is used as the substrate 18, and the substrate 18 is doped with electrons, so that a GaAs doped layer 14 (semiconductor layer 14) is formed, a two-dimensional electron gas layer 16 is formed between the GaAs doped layer 14 and the substrate 18. In this case, the GaAs doped layer 14 and the two-dimensional electron gas layer 16 function as the channel part 15. As described above, the channel part 15 may have a two-layer structure. The length of the channel part 15 between the source part 11 and the drain part 12 is about several tens of nm, for example. Further, the thickness of the channel part 15 from the substrate 18 is about several tens of nm, for example. The thickness of the source part 11 or the drain part 12 from the substrate 18 may just be thicker than the thickness of the channel part 15 from the substrate 18. For example, the thickness of the source part 11 or the drain part 12 from the substrate 18 may be about 1.05 to 20 times the thickness of the channel part 15 from the substrate 18.

The circularly polarized light irradiation part 51 has a function to emit circularly polarized light. As a light source, a semiconductor LED is used, for example. The light source has a wavelength selected according to the material of the channel part 15. For example, when the channel part 15 is formed of a semiconductor, a light source having a wavelength of from visible light to an infrared region is used. The circularly polarized light irradiation part 51 includes a quarterwave plate that allows linearly polarized laser light to pass through. Alternatively, the circularly polarized light irradiation part 51 includes optical crystal to which an electric field of a Pockels cell that allows the linearly polarized laser light to pass through can be applied. The circularly polarized light irradiation part 51 may include a mechanism of adjusting a spot width of a condenser lens and the like. Further, the circularly polarized light irradiation part 51 may be connected to a circularly polarized light control part 52 for controlling the wavelength of the circularly polarized light and the direction of rotation of the circularly polarized light.

The circularly polarized light irradiation part 51 irradiates the channel part 15 with the circularly polarized light to control the direction of spin of the channel part 15. The circularly polarized light irradiation part 51 may irradiate a first direction, that is, a direction along a magnetization direction of the source part 11 and the drain part 12, with the circularly polarized light. When the channel part 15 is formed of a semiconductor material, the circularly polarized light irradiation part 51 may irradiate the channel part 15 with the circularly polarized light having a wavelength corresponding to energy of band gap energy or more of the channel part 15.

Figure 2:
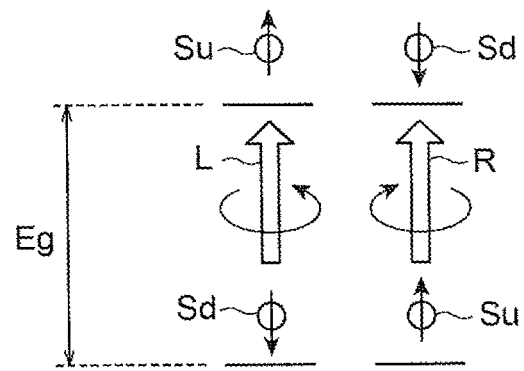
FIGS. 2(A) and 2(B) are schematic diagrams for describing spin control by a circularly polarized light irradiation part.
Figure 2:
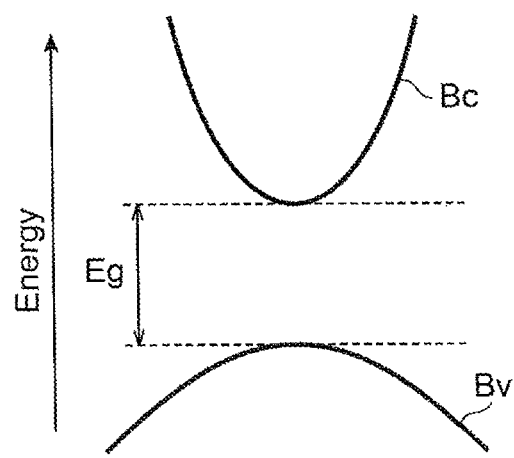

Here, spin control by the circularly polarized light irradiation part 51 will be described with reference to FIGS. 2(A) and 2(B). FIGS. 2(A) and 2(B) are schematic diagrams describing spin control by the circularly polarized light irradiation part 51. Note that FIGS. 2(A) and 2(B) schematically illustrate an example of a case where the channel part 15 is formed of a semiconductor material. FIG. 2(A) illustrates an example of a relationship between a type of spin and the direction of the circularly polarized light. Further, in FIG. 2(A), down-spin Sd indicates downward spin, and up-spin Su indicates upward spin. Further, left circularly polarized light L indicates counterclockwise circularly polarized light, and right circularly polarized light R indicates clockwise circularly polarized light.

As illustrated in FIG. 2(A), when the down-spin Sd is irradiated with left circularly polarized light L, the spin receives energy from the left circularly polarized light L and is reversed, and becomes the up-spin Su. Meanwhile, when the up-spin Su is irradiated with the right circularly polarized light R, the spin receives energy from the right circularly polarized light R and is reversed, and becomes the down-spin Sd. As described above, by use of the left circularly polarized light L and the right circularly polarized light R according to the situation, the direction of spin of the channel part 15 can be controlled. Further, when an electron is irradiated with the circularly polarized light, an energy state becomes high. Therefore, by being irradiated with the circularly polarized light, the electron in a valence band is transferred to a conduction band beyond an energy gap. As described above, only electrons having a specific direction of spin can be transferred by change of the wavelength (energy), in addition to the direction of rotation of the circularly polarized light.

Note that the relationship between the up-spin Su and the down-spin Sd, and the right circularly polarized light R and the left circularly polarized light L illustrated in FIG. 2(A) is an example, and is changed due to the material, physical characteristics, or other causes. Further, the relationship between the spin reversal and the circularly polarized light may be provided according to a selection rule determined for each substance.

FIG. 2(B) illustrates an example of a band gap, which is typically seen in semiconductors. As illustrated in FIG. 2(B), a band structure of a semiconductor material is typically divided into a valence band Bv and a conduction band Bc. The valence band Bv is shown with a lower value than the conduction band Bc when an energy axis is the vertical axis, and the horizontal axis is indicated by a wavenumber or momentum. In a semiconductor in which direct transition occurs, such as GaAs, the wavenumber with which the valence band Bv becomes high, and the wavenumber with which the conduction band Bc becomes low are the same wavenumber. An energy difference between the valence band Bv and the conduction band Bc is band gap energy Eg.

Therefore, when the channel part 15 is formed of GaAs, the circularly polarized light irradiation part 51 irradiates the channel part 15 with the circularly polarized light having a wavelength corresponding to the band gap energy Eg of GaAs or slightly higher energy, so that the spin of the channel part 15 is transferred from the valence band Bv to the conduction band Bc. Therefore, by employment of a semiconductor that directly transfers, the current injected from the source part 11 can be caused to efficiently flow to the drain part 12. Note that the band gap energy Eg of GaAs is about 1.43 eV at room temperature, and a wavelength corresponding to the energy can be selected.

Figure 3:
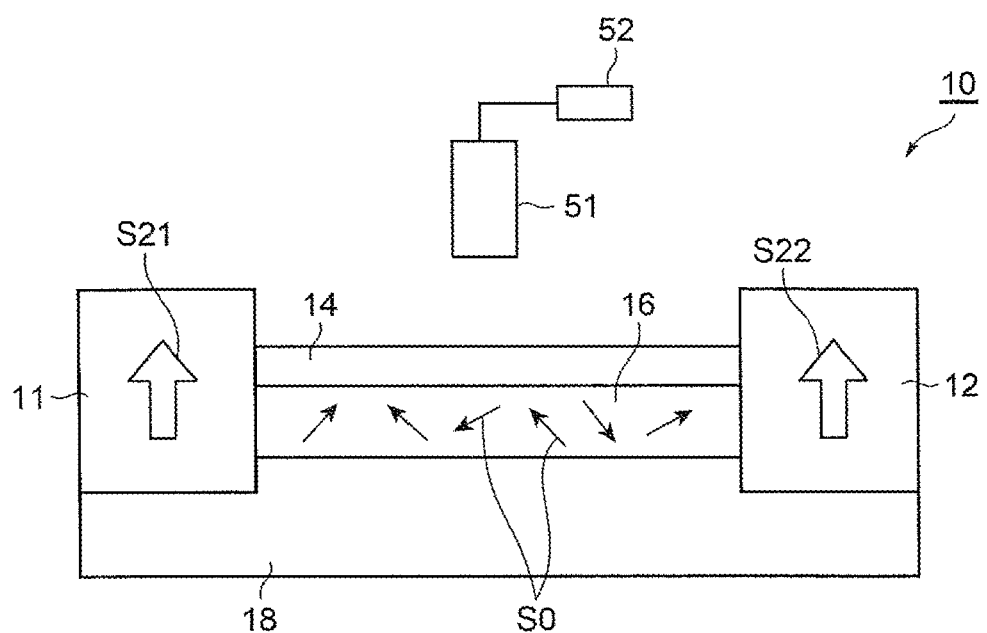
FIG. 3 is a schematic diagram for describing directions of spin when the spin polarization transistor element in the first embodiment is in an OFF state.
Figure 4:
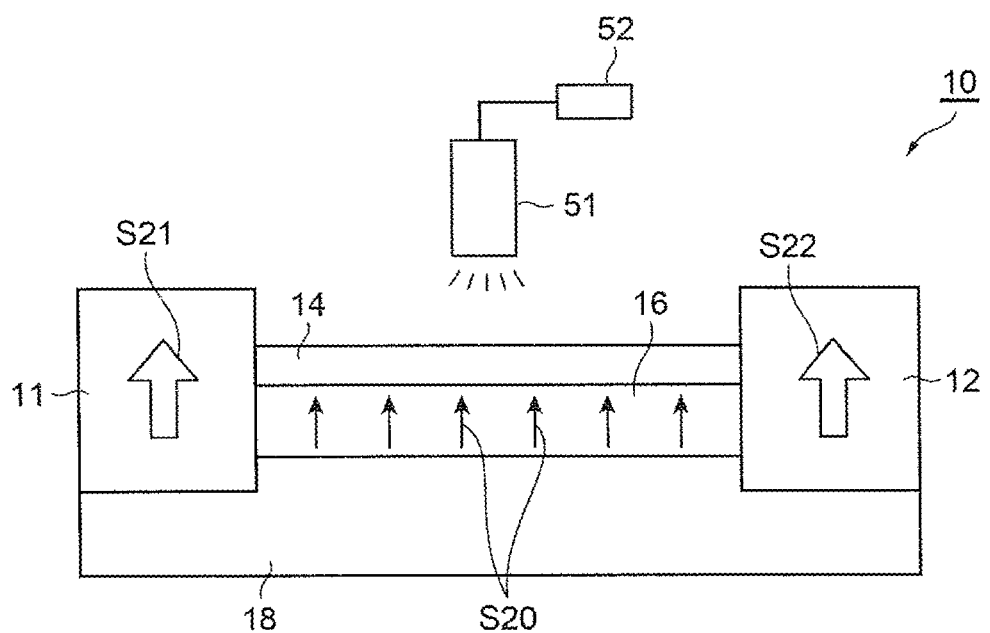
FIG. 4 is a schematic diagram for describing directions of spin when the spin polarization transistor element in the first embodiment is in an ON state.

Next, an ON/OFF state of the spin polarization transistor element 10 will be generally described. FIG. 3 is a schematic diagram for describing the direction of spin when the spin polarization transistor element 10 is in an OFF state. FIG. 4 is a schematic diagram for describing the direction of spin when the spin polarization transistor element 10 is in an ON state.

As illustrated in FIG. 3, the source part 11 is magnetized in a direction perpendicular to the substrate 18 (substrate vertical direction), and has a magnetic moment S21. Similarly, the drain part 12 is magnetized in the direction perpendicular to the substrate 18, and has a magnetic moment S22. The magnetic moment S21 and the magnetic moment S22 are parallel to each other. When the channel part 15 is not irradiated with the circularly polarized light, directions of spin S0 in the two-dimensional electron gas layer 16 are random. Therefore, the current does not flow from the source part 11 to the drain part 12 (the OFF state).

Next, as illustrated in FIG. 4, the circularly polarized light irradiation part 51 irradiates an upper surface of the channel part 15 with the circularly polarized light. The circularly polarized light irradiation part 51 irradiates the substrate 18 with the circularly polarized light in the vertical direction. When directions of spin are aligned to the substrate vertical direction, it is more efficient to irradiate the substrate with the circularly polarized light in the substrate vertical direction. When the circularly polarized light irradiation part 51 irradiates the channel part 15 with the circularly polarized light, the spin S0 is aligned to the direction perpendicular to the substrate 18 (spin S20). That is, the directions of spin of the channel part 15 are aligned to the magnetization direction of the source part 11 and the drain part 12. Therefore, the current flows from the source part 11 to the drain part 12 (the ON state).

Note that, when the source part 11 and the drain part 12 have the thicknesses sufficiently longer than the approach length of the circularly polarized light, the circularly polarized light irradiation part 51 does not need to accurately irradiate only the upper surface of the channel part 15, and may irradiate upper surfaces of the source part 11 and the drain part 12. As described above, by adjustment of film thicknesses of the source part 11 and the drain part 12, the accuracy of an irradiation range of light can be relaxed.

As described above, according to the spin polarization transistor element 10 of the first embodiment, the circularly polarized light irradiation part 51 irradiates the channel part 15 with the circularly polarized light, and electrons with polarized spin are excited in the channel part 15, and electrical resistance of the channel part 15 is changed. Therefore, the current injected from the source part 11 can be caused to flow to the drain part 12. Further, when the magnetization direction of the source part 11 and the drain part 12 is the substrate vertical direction, the circularly polarized light irradiation part 51 irradiates the channel part 15 with the circularly polarized light in the direction along the substrate vertical direction, whereby the directions of spin of the channel part 15 can be aligned in the substrate vertical direction. Therefore, the spin polarization transistor element 10 can be switched from the OFF state to the ON state. As described above, switching of the current is performed using the circularly polarized light in non-contact manner, and thus it is not necessary to form the gate electrode on the element. Therefore, micromachining for the gate electrode is unnecessary, and manufacturing of the element becomes easy. Further, it is not necessary to secure the region where the gate electrode is formed, and thus the distance between the source part 11 and the drain part 12 can be made narrow. For example, to provide a gate electrode of about 1 µM, it is necessary to have a space of about 3 urn between the source part 11 and the drain part 12. In contrast, according to the spin polarization transistor element 10 of the first embodiment, the space between the source part 11 and the drain part 12 can be made several nm. Therefore, the transistor structure can be downsized. In addition, a switching speed of the circularly polarized light directly depends on a gate modulation speed. Therefore, the element can be operated at a speed equal to or more than a current CMOS element.

Further, when the channel part 15 is formed of a semiconductor material, when the channel part 15 is irradiated with the circularly polarized light, the spin in the semiconductor material that forms the channel part 15 can be transferred from the valence band to the conduction band. Therefore, the current injected from the source part 11 can be caused to more efficiently flow to the drain part 12. Further, when the channel part 15 includes the two-dimensional electron gas layer 16, spin is supplied from the two-dimensional electron gas layer 16 to the channel part 15. Therefore, propagation of angular momentum of the spin in the channel part 15 can be efficiently performed.

Second Embodiment

A spin polarization transistor element 10 according to a second embodiment is nearly similarly configured to the spin polarization transistor element 10 of the first embodiment, and is different in the direction of magnetization of a source part 11, the direction of magnetization of a drain part 12, the direction of spin flowing in a channel part 15, and the irradiation direction of circularly polarized light irradiated by a circularly polarized light irradiation part 51. Hereinafter, considering easy understanding of description, description overlapping with the spin polarization transistor element 10 according to the first embodiment is omitted, and the different points will be mainly described.

Figure 5:
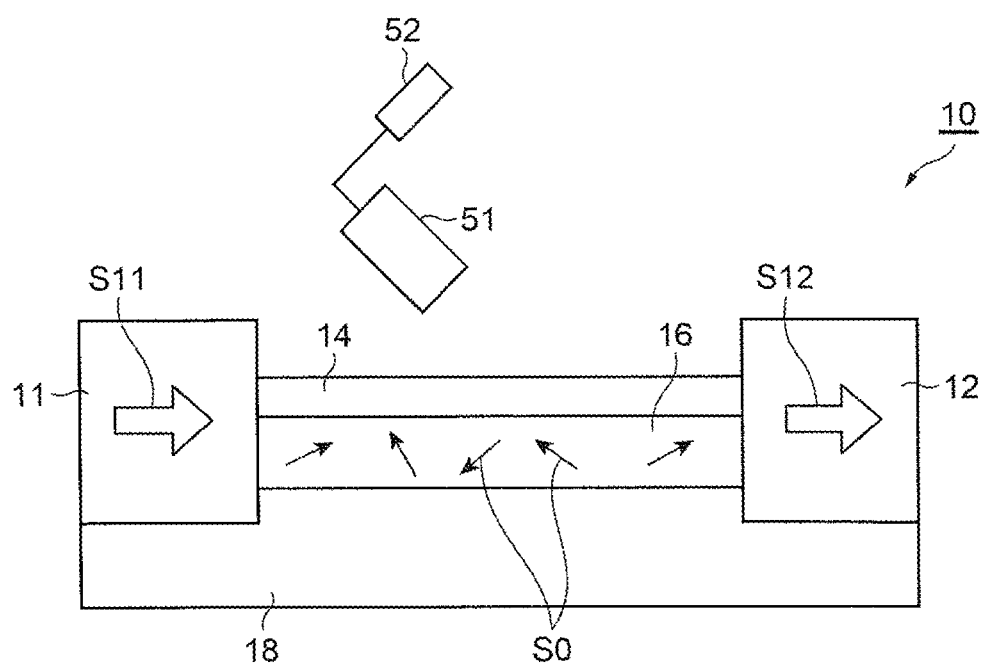
FIG. 5 is a schematic diagram for describing directions of spin when a spin polarization transistor element in a second embodiment is in an OFF state.
Figure 6:
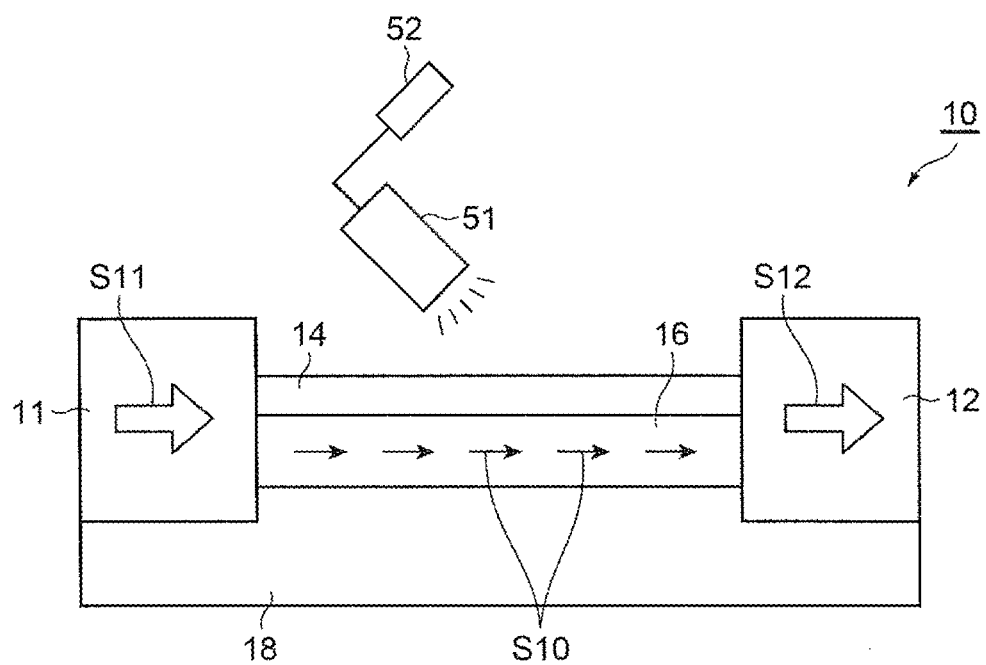
FIG. 6 is a schematic diagram for describing directions of spin when the spin polarization transistor element in the second embodiment is in an ON state.

FIG. 5 is a schematic diagram for describing directions of spin when a spin polarization transistor element in the second embodiment is in an OFF state. FIG. 6 is a schematic diagram for describing directions of spin when the spin polarization transistor element in the second embodiment is in an ON state.

As illustrated in FIG. 5, the source part 11 is magnetized in an in-plane direction of a substrate 18, and has a magnetic moment S11. Further, the drain part 12 is magnetized in the in-plane direction of the substrate 18, and has a magnetic moment S12. The magnetic moment S11 and the magnetic moment S12 are directed to the same direction. When the channel part 15 is not irradiated with the circularly polarized light, directions of spin S0 in a two-dimensional electron gas layer 16 are random. Therefore, a current does not flow between the source part 11 and the drain part 12 (the OFF state).

Next, a case where the circularly polarized light is irradiated will be described in FIG. 6. As illustrated in FIG. 6, the circularly polarized light irradiation part 51 irradiates the channel part 15 with the circularly polarized light such that an approach angle (an incident angle to the channel part 15, which is 0 degrees when the angle is parallel to a surface direction of the channel part 15) of the circularly polarized light to the channel part 15 becomes an angle smaller than 90 degrees. When the directions of spin are aligned to a substrate in-plane direction, it is more efficient to irradiate the channel part 15 with the circularly polarized light in the substrate in-plane direction. That is, when the source part 11 and the drain part are magnetized in the in-plane direction of the substrate 18, it is more efficient that the circularly polarized light irradiation part 51 irradiates the channel part 15 with the circularly polarized light in the substrate in-plane direction such that the approach angle of the circularly polarized light to the channel part 15 becomes as low angle as possible, favorably becomes an angle close to 0 degrees. When the circularly polarized light irradiation part 51 irradiates the channel part 15 with the circularly polarized light, the spin S0 is aligned to a plane direction including the source part 11 and the drain part 12, in other words, to the in-plane direction of the substrate 18 (spin S10). That is, the directions of the spin of the channel part 15 are aligned to the magnetization direction of the source part 11 and the drain part 12. Therefore, the current flows between the source part 11 and the drain part 12 (the ON state).

As described above, according to the spin polarization transistor element 10 of the second embodiment, similar effects to the spin polarization transistor element 10 of the first embodiment are exhibited.

Third Embodiment

A spin polarization transistor element 20 according to a third embodiment is an element in which a plurality of a part of configuration elements of the spin polarization transistor element 10 according to the first embodiment is arrayed. Hereinafter, considering easy understanding of description, description overlapping with the spin polarization transistor element 10 according to the first embodiment is omitted, and different points will be mainly described.

Figure 7:
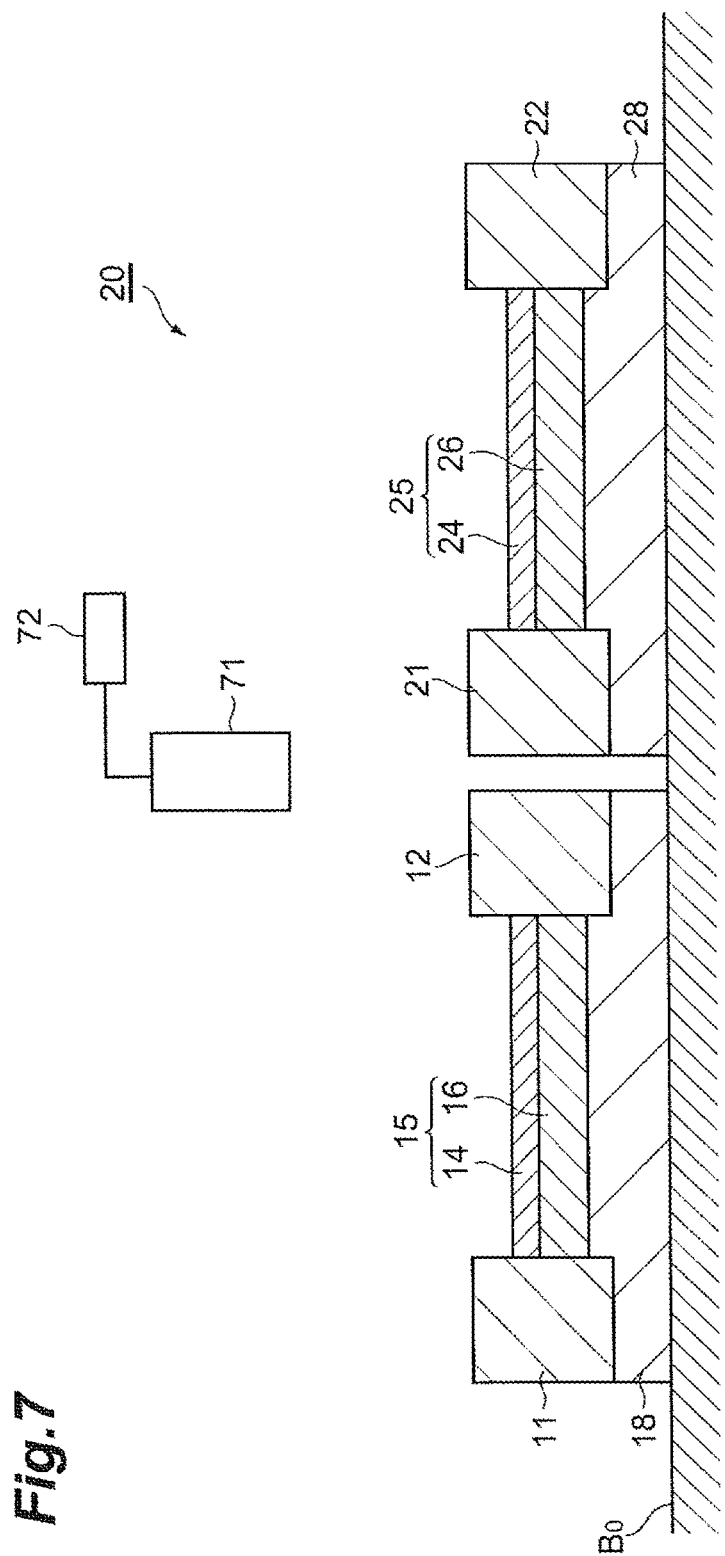
FIG. 7 is a schematic diagram for describing a spin polarization transistor element in a third embodiment.

FIG. 7 is a schematic diagram for describing the spin polarization transistor element 20 in the third embodiment. As illustrated in FIG. 7, the spin polarization transistor element 20 has a structure in which a plurality of a part of configuration elements of the spin polarization transistor element 10 according to the first or second embodiment is arrayed on a substrate $B_0$. That is, the spin polarization transistor element 20 includes a first source part 11, a first drain part 12, and a first channel part 15, which are the configuration elements of the spin polarization transistor element 10 according to the first or second embodiment. Further, the spin polarization transistor element 20 includes a second source part 21, a second drain part 22, and a second channel part 25, which are the configuration elements of the spin polarization transistor element 10 according to the first or second embodiment. The first source part 11, the first drain part 12, the second source part 21, and the second drain part 22 are magnetized in a first direction.

Further, the spin polarization transistor element 20 includes a circularly polarized light irradiation part 71, which is similar to the circularly polarized light irradiation part 51 included in the spin polarization transistor element 10 according to the first or second embodiment. The circularly polarized light irradiation part 71 according to the present embodiment is different from the circularly polarized light irradiation part 51 in only an irradiation destination (an irradiation area), but has the same structure. Further, the circularly polarized light irradiation part 71 may be connected to a circularly polarized light control part 72 for controlling a wavelength of circularly polarized light and a direction of rotation of the circularly polarized light.

The circularly polarized light irradiation part 71 irradiates the first channel part 15 and the second channel part 25 with the circularly polarized light to control directions of spin of the first channel part 15 and the second channel part 25. The circularly polarized light irradiation part 71 may irradiate the first and second channel parts with the circularly polarized light in a direction along the first direction.

As described above, according to the spin polarization transistor element 20 according to the third embodiment, the circularly polarized light irradiation part 71 irradiates the first channel part 15 and the second channel part 25 with the circularly polarized light, and electrons with polarized spin are excited in the first channel part 15 and the second channel part 25, and electrical resistance of the first channel part 15 and the second channel part 25 is changed. Therefore, the transistor structure can be downsized, similarly to the spin polarization transistor element 10 according to the first and second embodiments.

Further, according to the spin polarization transistor element 20 of the third embodiment, the circularly polarized light irradiation part 71 that is common between the transistor configuration elements is included, and irradiates the plurality of spin polarization transistors with the circularly polarized light, whereby the plurality of spin polarization transistors can be collectively controlled.

Fourth Embodiment

A spin polarization transistor element 30 according to a fourth embodiment is nearly similarly configured to the spin polarization transistor element 20 according to the third embodiment, and is different in that a circularly polarized light irradiation part is included in transistor element units. Hereinafter, considering easy understanding of description, description overlapping with the spin polarization transistor element 20 according to the third embodiment is omitted, and the different point will be mainly described.

FIG. 8 is a schematic diagram for describing the spin polarization transistor element 30 according to the fourth embodiment. As illustrate in FIG. 8, the spin polarization transistor element 30 includes a structure in which a plurality of spin polarization transistor elements 10 according to the first or second embodiment is arrayed on a substrate $B_0$. That is, the spin polarization transistor element 30 includes spin polarization transistor elements 10A and 10B, which have the same structure as the spin polarization transistor element 10 according to the first or second embodiment. The spin polarization transistor elements 10A and 10B include a first circularly polarized light irradiation part 51 and a second circularly polarized light irradiation part 61, respectively. A first source part 11, a first drain part 12, a second source part 21, and a second drain part 22 are magnetized in a first direction.

The first circularly polarized light irradiation part 51 irradiates a first channel part 15 with the circularly polarized light to control spin in a substance that configures the first channel part 15. The second circularly polarized light irradiation part 61 irradiates a second channel part 25 with the circularly polarized light to control spin in a substance that configures the second channel part 25. The circularly polarized light irradiation part 71 is the same as the circularly polarized light irradiation part 71 of the spin polarization transistor of the third embodiment.

As described above, according to the spin polarization transistor element 30 of the fourth embodiment, the circularly polarized light irradiation part 71 irradiates the first channel part 15 and the second channel part 25 with the circularly polarized light, and electrons with polarized spin are excited in the first channel part 15 and the second channel part 25, and electrical resistance of the first channel part 15 and the second channel part 25 is changed. Therefore, the transistor structure can be downsized, similarly to the spin polarization transistor element 10 according to the third embodiment.

Further, according to the spin polarization transistor element 30 of the fourth embodiment, the circularly polarized light irradiation part 71 that is common between the transistor configuration elements is included, and irradiates the plurality of spin polarization transistors with the circularly polarized light, whereby the plurality of spin polarization transistors can be collectively controlled.

Further, according to the spin polarization transistor element 30 of the fourth embodiment, the first circularly polarized light irradiation part 51 and the second circularly polarized light irradiation part 61 that are independent between the transistor configuration elements, and respectively irradiate the plurality of spin polarization transistors with the circularly polarized light, whereby the plurality of spin polarization transistors can be individually controlled.

The above described embodiments illustrate examples of the spin polarization transistors of the present invention. The present invention is not limited to the spin polarization transistors according to the embodiments, and may be modified or may be applied to other embodiments.

For example, in the above-described embodiments, the channel part 15 is directly bonded with the source part 11 and the drain part 12. However, the channel part 15 may be bonded with the source part 11 and the drain part 12 through a tunnel layer or the like. Even with such a configuration, the spin polarization transistor element 10 can be realized.

Further, in the above-described embodiments, examples have been described, in which the circularly polarized light irradiation part 51 is arranged above the channel part 15 arranged on the substrate 18, and irradiates the channel part 15 with the circularly polarized light from a surface side of the substrate. However, the circularly polarized light irradiation part 51 may be arranged on a back surface side of the substrate 18, and may irradiate the substrate 18 with the circularly polarized light from the back surface side. At this time, the substrate 18 on which the channel part 15 is layered may be thinned by means of partial etching. Even with such a configuration, the directions of spin of the channel part 15 can be controlled with the circularly polarized light.

Further, in the above-described embodiments, examples have been described, which do not require a gate electrode that is seen in a conventional field effect transistor. However, a configuration in which a gate electrode is provided on the channel part 15, and the circularly polarized light irradiation part 51 is provided may be employed. That is, the circularly polarized light irradiation part 51 may be operated as an assist mechanism of spin control with the gate electrode. When the circularly polarized light irradiation part 51 is operated as the assist mechanism, the gate electrode may be formed to be thin, and the circularly polarized light may be irradiated from the back surface side of the substrate 18 in order to cause the element to further exert the effects of the circularly polarized light. Even with such a configuration, it is not necessary to provide the gate electrode in an area irradiated with the circularly polarized light. Therefore, the distance between the source and the drain can be made small and the element can be downsized. Further, with the assist mechanism, a voltage to be applied from the gate electrode can be decreased. Therefore, a mechanism that applies a gate voltage itself can be simplified, which contributes to the downsizing of the element.

Further, in the above-described embodiments, examples have been described, in which the current flows from the source part 11 to the drain part 12, and the transistor is turned to the ON state at timing when the circularly polarized light irradiation part 51 irradiates the channel part 15 with the circularly polarized light. However, the spin of the channel part 15 may be controlled such that the transistor is turned to the OFF state at timing when the circularly polarized light irradiation part 51 irradiates the channel part 15 with the circularly polarized light.

Further, FIGS. 7 and 8 illustrate examples in which the two element configuration elements are arrayed. However, three or more element configuration elements may be arrayed. Further, the substrates 18 and 28 may be commonized, and the substrate $B_0$ may not be used. Further, examples in which the first source part 11, the first drain part 12, the second source part 21, and the second drain part 22 are magnetized in the first direction have been described. However, the magnetization direction (for example, the first direction) of the first source part 11 and the first drain part 12, and the magnetization direction (for example, the second direction) of the second source part 21 and the second drain part 22 may be different directions.

Further, in the above-described embodiments, examples have been described, in which one element configuration element includes the source part, the drain part, and the channel part. However, the source part and the drain part of adjacent element configuration elements may be configured from one member. For example, as illustrated in FIG. 9, the first drain part 12 and the second source part 21 are commonized to form a terminal 41. As described above, the member can be used for more than one purpose. Therefore, the transistor element can be further downsized. Further, the substrates 18 and 28 may be commonized to form a substrate 42.

INDUSTRIAL APPLICABILITY

The spin polarization transistor element 10 has industrial applicability as follows. The spin polarization transistor element 10 can be used as an electric component and/or an electronic component in industrial fields. For example, the spin polarization transistor element 10 can be applied as gate control in a ferromagnetic material/semiconductor hybrid structure such as an in-plane spin transistor or a vertical nanopillar.

REFERENCE SIGNS LIST

10 . . . Spin polarization transistor element, 11 . . . Source part, 12 . . . Drain part, 14 . . . GaAs doped layer (semiconductor layer), 15 . . . channel part, 16 . . . Two-dimensional electron gas layer, 51 . . . Circularly polarized light irradiation part.

What is claimed is:

1. A spin polarization transistor element comprising:
a source part made of a ferromagnetic material magnetized in a first direction;
a drain part made of a ferromagnetic material magnetized in the first direction, and separated from and arranged in parallel to the source part;
a channel part arranged between the source part and the drain part, and bonded with the source part and the drain part directly or through a tunnel layer; and
a circularly polarized light irradiation part configured to irradiate the channel part with circularly polarized light for controlling a direction of spin of the channel part.

2. The spin polarization transistor element according to claim 1, wherein the channel part is formed of a semiconductor material, and the circularly polarized light irradiation part irradiates the channel part with circularly polarized light having a wavelength corresponding to energy of band gap energy or more of the channel part.

3. The spin polarization transistor element according to claim 2, wherein the channel part is formed of gallium arsenide (GaAs).

4. The spin polarization transistor element according to claim 1, wherein the circularly polarized light irradiation part irradiates the channel part with the circularly polarized light in a direction along the first direction.

5. The spin polarization transistor element according to claim 4, comprising:
a substrate, wherein
the source part and the drain part are formed on the substrate, the first direction is a direction perpendicular to the substrate, and the circularly polarized light irradiation part irradiates the channel part with the circularly polarized light in a direction along the first direction.

6. The spin polarization transistor element according to claim 1, comprising:
a substrate, wherein
the source part and the drain part are formed on the substrate, the first direction is a substrate in-plane direction, and the circularly polarized light irradiation part irradiates the channel part with the circularly polarized light such that an approach angle of the circularly polarized light to the channel part becomes an angle smaller than 90 degrees.

7. The spin polarization transistor element according to claim 1, wherein the channel part includes a two-dimensional electron gas layer.

8. The spin polarization transistor element according to claim 1, wherein thicknesses of the source part and the drain part are a thickness exceeding an approach length of the circularly polarized light.

9. The spin polarization transistor element according to claim 8, wherein the thicknesses of the source part and the drain part are thicker than a thickness of the channel part.

10. A spin polarization transistor element comprising:
a first source part made of a ferromagnetic material magnetized in a first direction;
a first drain part made of a ferromagnetic material magnetized in the first direction, and separated from and arranged in parallel to the first source part;
a first channel part arranged between the first source part and the first drain part, and bonded with the first source part and the first drain part directly or through a tunnel layer;
a second source part made of a ferromagnetic material magnetized in a second direction;
a second drain part made of a ferromagnetic material magnetized in the second direction, and separated from and arranged in parallel to the second source part;
a second channel part arranged between the second source part and the second drain part, and bonded with the second source part and the second drain part directly or through a tunnel layer; and
a circularly polarized light irradiation part configured to irradiate the first channel part and the second channel part with circularly polarized light for controlling directions of spin of the first channel part and the second channel part.

11. The spin polarization transistor element according to claim 10, comprising:
a first circularly polarized light irradiation part configured to irradiate the first channel part with the circularly polarized light to control spin in a substance that configures the first channel part; and
a second circularly polarized light irradiation part configured to irradiate the second channel part with the circularly polarized light to control spin in a substance that configures the second channel part.

12. The spin polarization transistor element according to claim 10, wherein thicknesses of the first source part, the second source part, the first drain part, and the second drain part are a thickness exceeding an approach length of the circularly polarized light.

13. The spin polarization transistor element according to claim 12, wherein the thicknesses of the first source part and the first drain part are thicker than the thickness of the first channel part, and
the thicknesses of the second source part and the second drain part are thicker than the thickness of the second channel part.

* * * * *